(12) United States Patent
Jang

(10) Patent No.: US 6,990,032 B2
(45) Date of Patent: Jan. 24, 2006

(54) SEMICONDUCTOR MEMORY DEVICE CAPABLE OF STABLY PERFORMING ENTRY AND EXIT OPERATIONS OF SELF REFRESH MODE AND THE SELF REFRESH METHOD THEREOF

(75) Inventor: Eun-Jung Jang, Ichon-shi (KR)

(73) Assignee: Hynix Semiconductor Inc., (KR)

( * ) Notice: Subject to any disclaimer, the term of this patent is extended or adjusted under 35 U.S.C. 154(b) by 83 days.

(21) Appl. No.: 10/814,675

(22) Filed: Mar. 30, 2004

(65) Prior Publication Data

US 2005/0195674 A1 Sep. 8, 2005

(30) Foreign Application Priority Data

Mar. 3, 2004 (KR) ....................... 10-2004-0014420

(51) Int. Cl.
*G11C 7/00* (2006.01)

(52) U.S. Cl. .................... 365/222; 365/233; 365/233.5
(58) Field of Classification Search ................ 365/222, 365/233, 233.5

See application file for complete search history.

(56) References Cited

U.S. PATENT DOCUMENTS

| 6,333,886 | B2 * | 12/2001 | Cho et al. | 265/222 |
| 6,912,169 | B2 * | 6/2005 | Choi | 365/222 |
| 2004/0240296 | A1 * | 12/2004 | Jeong | 365/222 |

* cited by examiner

*Primary Examiner*—VanThu Nguyen
(74) *Attorney, Agent, or Firm*—Blakely Sokoloff Taylor & Zafman

(57) ABSTRACT

A semiconductor memory device includes a clock enable signal self refresh buffer for generating a self refresh clock enable signal by receiving the clock enable signal in the self refresh mode, an internal clock signal generating unit for generating an internal clock signal by receiving the external clock signal, a signal synchronization unit for generating an internal clock enable signal by synchronizing the clock enable signal with the internal clock signal, a level detection unit for generating a level detection signal by detecting levels of the internal clock enable signal and the self refresh clock enable signal, a clock self refresh buffer for receiving the external clock signal during a self refresh mode in response to the level detection signal, and a self refresh command generation unit for activating a self refresh command in response to the level detection signal and inactivating the self refresh command in response to the level detection signal and an output signal of the clock self refresh buffer.

23 Claims, 15 Drawing Sheets

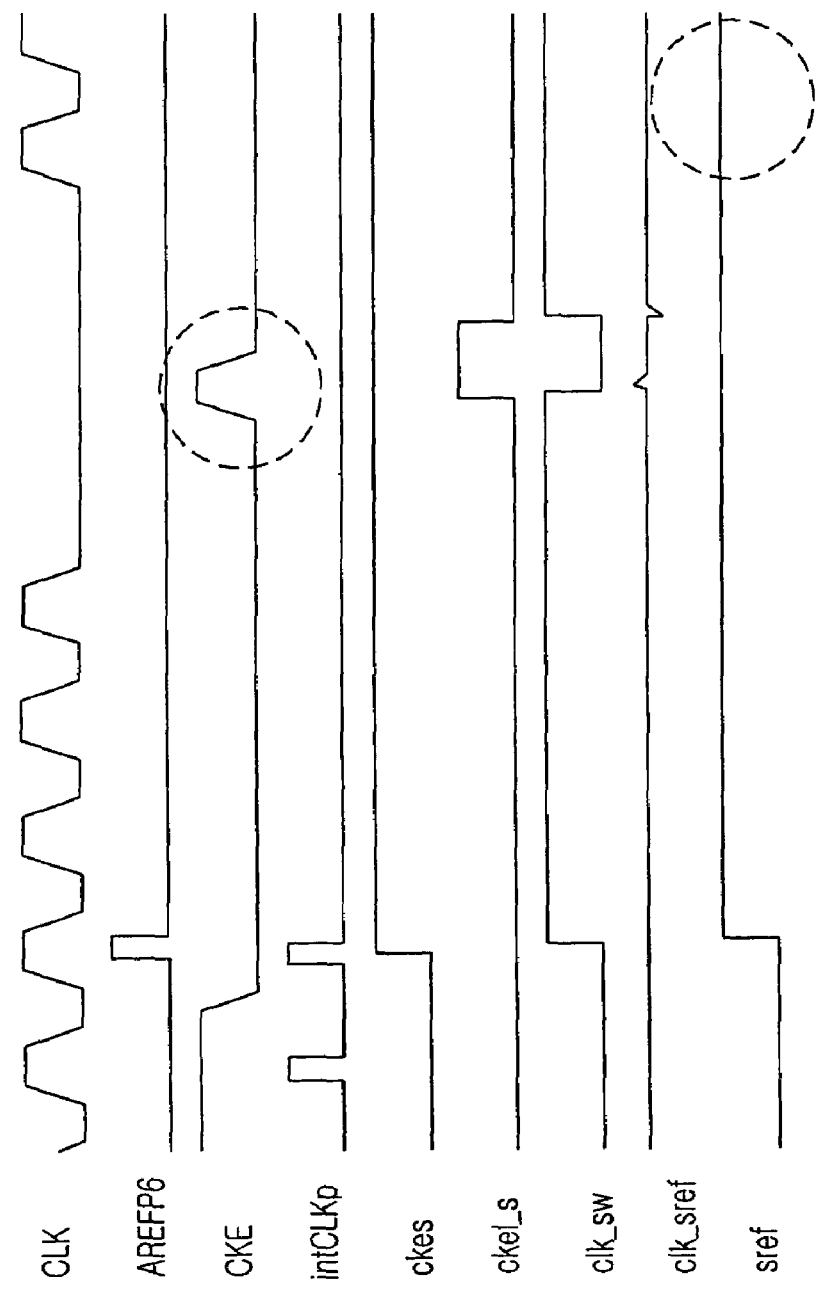

SEMICONDUCTOR MEMORY DEVICE CAPABLE OF STABLY PERFORMING ENTRY AND EXIT OPERATIONS OF SELF REFRESH MODE AND THE SELF REFRESH METHOD THEREOF

FIELD OF THE INVENTION

The present invention relates to a semiconductor memory device; and, more particularly, to a semiconductor memory device capable of stably performing a self refresh operation and the self refresh method thereof.

DESCRIPTION OF THE RELATED ART

Generally, data are stored in a cell capacitor as a charge in a dynamic random access memory (DRAM) and the stored charge is disappeared due to a leakage current. Therefore, a repeated process for periodically reading and amplifying the data from the cell capacitor and writing the amplified data to the cell capacitor is required before the data are completely disappeared. This process is called as a refresh operation.

After completing the refresh operation, a predetermined time for about 200 cycles of a clock signal is required to set a delay locked loop (DLL) circuit in a synchronous DRAM because setup values of the DLL circuit are disappeared due to power down of an input buffer and an output buffer by being deactivated during a refresh mode.

FIG. 1 is a block diagram illustrating a semiconductor memory device for a conventional self refresh mode.

As shown, the semiconductor memory device includes a clock normal buffer 10, a clock enable signal (CKE) normal buffer 20, a CKE refresh buffer 30, an internal clock signal generation unit 40, a CKE synchronization unit 50 and a self refresh command generation unit 60. The clock normal buffer 10 receives an external clock signal in a normal mode and the CKE normal buffer 20 receives the clock enable signal in the normal mode. The CKE self refresh buffer 30 receives the clock enable signal in a self refresh mode and generates a self refresh clock enable signal ckel_s, and the internal clock generation unit 40 generates an internal clock signal intCLKp by receiving an output signal intCLKl of the clock normal buffer 10. The CKE synchronization unit 50 outputs an internal clock enable signal ckes in synchronization with the internal clock signal intCLKp, and the self refresh command generation unit 60 generates a self refresh command sref by detecting levels of the self refresh clock enable signal ckel_s and the internal clock enable signal ckes.

For references, the buffers 10, 20 and 30 are enabled and disabled according to the self refresh command sref.

FIG. 2 is a timing diagram illustrating an operation of the semiconductor memory device of FIG. 1.

As shown, the clock enable signal CKE is firstly transited to a logic low level in a semiconductor memory device, and an auto refresh signal AREFP6 is inputted to the self refresh command generation unit 60, so that a command for entry to the self refresh mode is applied. Subsequently, the CKE clock synchronization unit 50 generates the internal clock enable signal ckes by synchronizing a buffered clock enable signal ckel inputted from the CKE normal buffer 20 with the internal clock signal intCLKp. The self refresh command generation unit 60 activates the self refresh command sref if activation of the auto refresh command AREFP6 is detected when the internal clock enable signal ckes is activated, so that the semiconductor memory device is entered into the self refresh mode.

An operation of the CKE self refresh buffer 30 is started and operations of the clock normal buffer 10 and the CKE normal buffer 20 are stopped in response to the self refresh command sref.

Thereafter, the clock enable signal CKE transited to a logic high level is applied, so that a command for exiting from the self refresh mode is applied. The self refresh command generation unit 60 inactivates the self refresh command sref in response to activation of the self refresh clock enable signal ckel_s inputted from the CKE self refresh buffer 30. Therefore, the semiconductor memory device exits from the self refresh mode.

Subsequently, since the clock normal buffer 10 and the CKE normal buffer 20 are operated in response to the self refresh command sref transited to a logic low level, the buffered clock enable signal ckel of the CKE normal buffer 20 is transited to a logic low level according to the clock enable signal CKE, and the internal clock generation unit 40 generates the internal clock signal intCLKp in response to the output signal intCLKl of the clock normal buffer 10. Accordingly, the CKE clock synchronization unit 50 transits the internal clock enable signal ckes to a logic low level by synchronizing the output signal ckel of the CKE normal buffer 20 with the internal clock signal intCLKp, so that it is prepared to enter the self refresh mode again. Also, an operation of the CKE self refresh buffer 30 is stopped in response to the self refresh mode command sref.

When the DRAM is entered to the self refresh mode, the input buffer is halted and the generation of the internal clock signal is stopped in order to reduce current consumption according to the prior art. The CKE self refresh buffer 30 is only operated for detecting level transition of the clock enable signal CKE to a logic high level in order to exit from the self refresh mode. Accordingly, since the internal clock signal is not generated in the self refresh mode, the exit of the self refresh mode is asynchronously performed regardless of the external clock signal.

Also, since the self refresh mode is implemented to extremely reduce power consumption of the DRAM such as a deep power down mode, operations of input buffers for receiving commands applied to the DRAM are halted and a power supply for generating a reference voltage is also terminated. In this situation, an input level of the clock enable signal should be maintained in a logic low level in order to keep the self refresh mode. However, since the clock enable signal may be not maintained in a logic low level due to a coupling noise between the board wires, a noise such a glitch is produced.

Therefore, since the CKE self refresh buffer 30 for detecting the clock enable signal in the self refresh mode is operated without synchronization with the internal clock signal, the self refresh mode can be terminated due to the noise such the glitch of the clock enable signal, so that there is a problem that a malfunction of the DRAM can be occurred.

SUMMARY OF THE INVENTION

It is, therefore, an object of the present invention to provide a semiconductor memory device capable of performing entry and exit operations of a self refresh mode in synchronization with an external clock signal and a self refresh method thereof.

In accordance with an aspect of the present invention, there is provided a semiconductor memory device, including: a clock enable signal self refresh buffer for generating a self refresh clock enable signal by receiving the clock enable signal in the self refresh mode; an internal clock signal generating unit for generating an internal clock signal by receiving the external clock signal; a signal synchronization unit for generating an internal clock enable signal by synchronizing the clock enable signal with the internal clock signal; a level detection unit for generating a level detection signal by detecting levels of the internal clock enable signal and the self refresh clock enable signal; a clock self refresh buffer for receiving the external clock signal during a self refresh mode in response to the level detection signal; and a self refresh command generation unit for activating a self refresh command in response to the level detection signal and inactivating the self refresh command in response to the level detection signal and an output signal of the clock self refresh buffer.

In accordance with another embodiment of the present invention, there is provided a semiconductor memory device including: a clock normal buffer for receiving an external clock signal in a normal mode; a clock enable signal (CKE) normal buffer for receiving the CKE in the normal mode; a CKE self refresh buffer for generating a self refresh clock enable signal by receiving the clock enable signal in the self refresh mode; an internal clock generation unit for internal clock signal by receiving an output signal of the clock normal buffer; a CKE clock synchronization unit for generating an internal clock enable signal by synchronizing the clock enable signal with the clock signal; a CKE level detection unit for generating a CKE level detection signal by detecting levels of the internal clock enable signal and the self refresh clock enable signal; a clock self refresh buffer for receiving the external clock signal during a self refresh mode in response to the CKE level detection signal; and a self refresh command generation unit for activating a refresh command in response to the CKE level signal and inactivating the refresh command in response to the CKE level signal and an output signal of the clock self refresh buffer.

In accordance with further another embodiment of the present invention, there is provided a self refresh method in a semiconductor memory device, including the steps of: a) inactivating a clock enable signal and applying an auto refresh signal; b) entering a self refresh mode in response to the clock enable signal synchronized with a clock signal; c) receiving the clock enable signal in the self refresh mode; d) activating the internal clock enable signal; and e) exiting from the self refresh mode in response to the clock enable signal synchronized with the clock signal.

In accordance with still another embodiment of the present invention, there is provided a self refresh method in a semiconductor memory device, including the steps of: a) activating a clock enable signal and applying an auto refresh signal; b) entering a self refresh mode in response to the clock enable signal synchronized with a clock signal; c) receiving the clock enable signal in the self refresh mode; d) updating a set value of a DLL circuit by receiving an external clock signal and activating the internal clock enable signal for a predetermined time referring to the clock signal in the self refresh mode; e) exiting from the self refresh mode in response to the clock enable signal synchronized with the clock signal when the clock enable signal is activated over the predetermined time.

BRIEF DESCRIPTION OF THE DRAWINGS

The above and other objects and features of the instant invention will become apparent from the following description of preferred embodiments taken in conjunction with the accompanying drawings, in which:

FIG. 10B is a waveform showing a result simulating an operation of the semiconductor memory device when an ineffective clock enable signal is activated while the external clock signal is not applied in FIG. 3;

DETAILED DESCRIPTION OF THE INVENTION

Hereinafter, a semiconductor memory device according to the present invention will be described in detail referring to the accompanying drawings.

Figure 3:
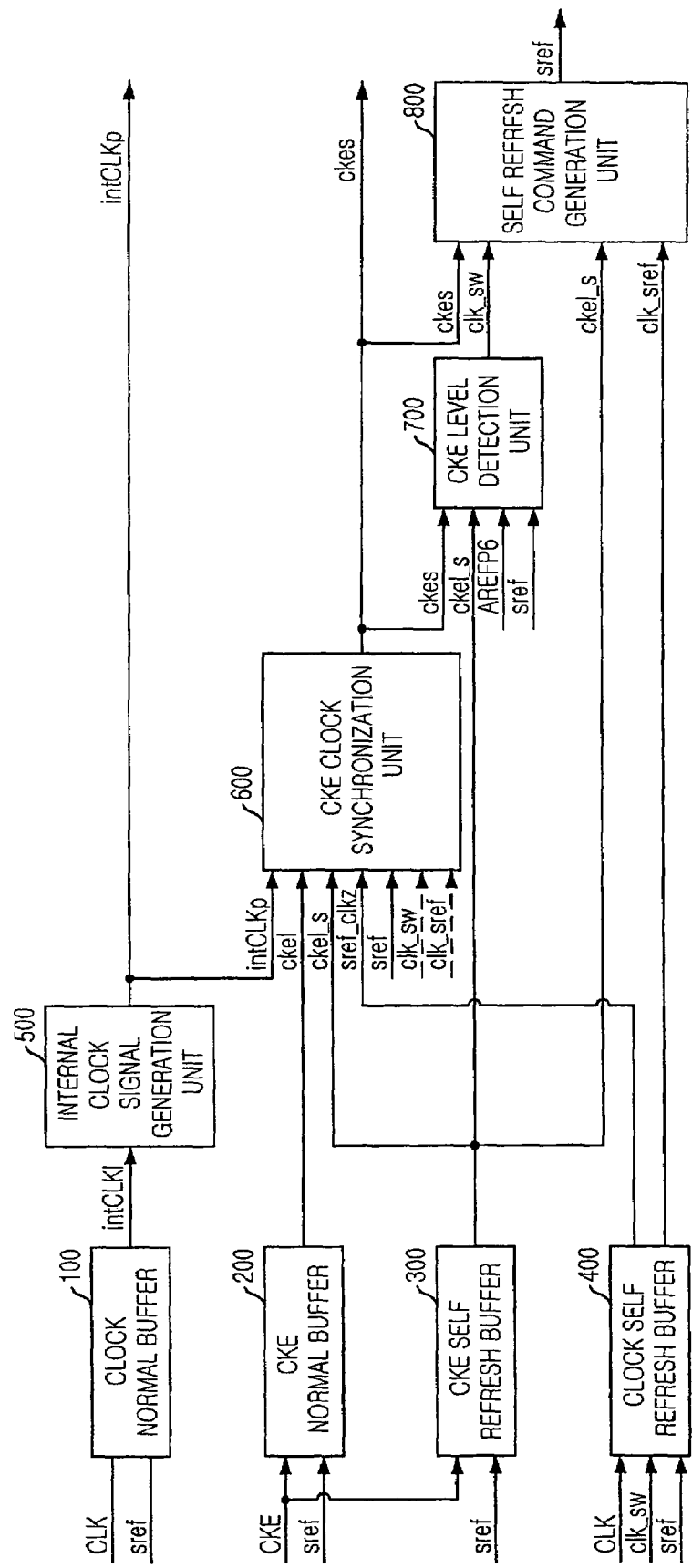
FIG. 3 is a block diagram illustrating a semiconductor memory device for performing entry and exit of self refresh mode in accordance with the preferred embodiment of the present invention.

FIG. 3 is a block diagram illustrating a semiconductor memory device for performing entry and exit operations of self refresh mode in accordance with the preferred embodiment of the present invention.

As shown, the semiconductor memory device includes a clock normal buffer 100, a clock enable signal (CKE) normal buffer 200, a CKE self refresh buffer 300, a clock self refresh buffer 400, an internal clock generation unit 500, a CKE clock synchronization unit 600, a CKE level detection unit 700 and a self refresh command generation unit 800.

The clock normal buffer 100 receives an external clock signal CLK in a normal mode and the CKE normal buffer 200 receives a clock enable signal in the normal mode. The CKE self refresh buffer 300 generates a self refresh clock enable signal ckel_s by receiving the clock enable signal in a self refresh mode, and the internal clock signal generation unit 500 generates an internal clock signal intCLKp by receiving an output signal intCLKl of the clock normal buffer 100. The CKE clock synchronization unit 600 outputs an internal clock enable signal ckes by synchronizing a buffered clock enable signal outputted from the CKE normal buffer 200 with the internal clock signal intCLKp.

The CKE level detection unit 700 produces a CKE level signal clk_sw by detecting levels of the internal clock enable signal ckes and the self refresh clock enable signal ckel_s, and the clock self refresh buffer 400 receives the external clock signal CLK under control of the CKE level signal clk_sw during the self refresh mode. The self refresh command generation unit 800 activates the self refresh command sref in response to the CKE level signal clk_sw and inactivates the self refresh command sref in response to the CKE-level signal clk_sw and a clock strobe signal clk_sref outputted from the clock self refresh buffer 400.

For a reference, as the CKE level signal clk_sw and the clock strobe signal clk_sref outputted from the CKE level detection unit 700 and the clock self refresh buffer 400, respectively, are additionally inputted to the CKE clock synchronization unit 600 in accordance with the present invention, an update operation of a delay locked loop (DLL) circuit can be carried out during a self refresh mode. Also, sizes of the CKE self refresh buffer 300 and the clock self refresh buffer 400 are relatively smaller than that of the clock normal buffer 100 and the CKE normal buffer 200, so that power consumption is relatively very low in accordance with the present invention.

Figure 4:
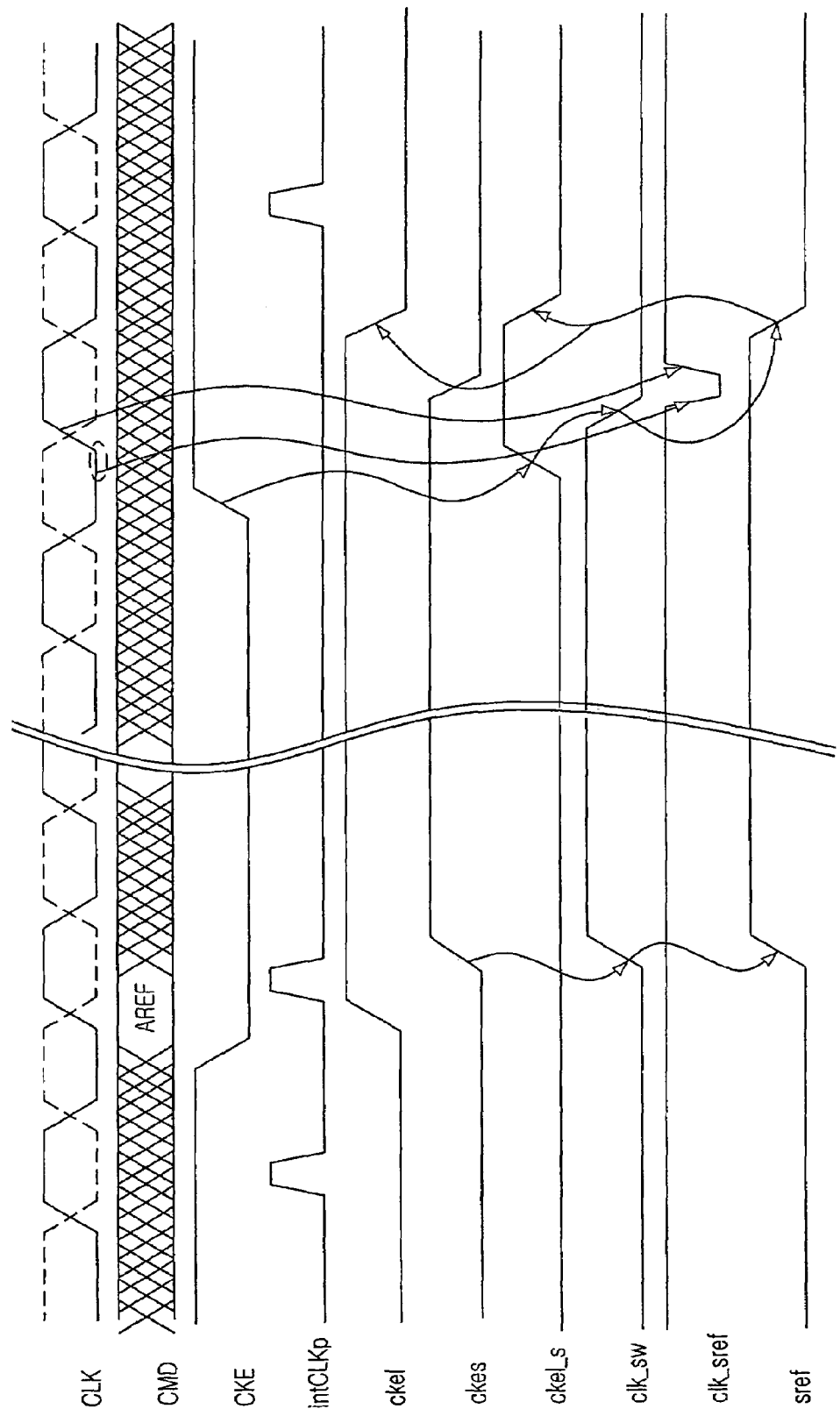
FIG. 4 is a waveform showing an operation of the semiconductor memory device in FIG. 3.

FIG. 4 is a waveform showing an operation of the semiconductor memory device in FIG. 3.

Hereinafter, an operation of the semiconductor memory device capable of stably performing entry and exit operations of the refresh mode referring to FIG. 4 will be described in accordance with the preferred embodiment of the present invention.

Firstly, the clock enable signal CKE is transited to a logic low level and an auto refresh signal AREF6 is inputted to the semiconductor memory device, so that a command for entering the self refresh mode is applied. Subsequently, the CKE clock synchronization unit 600 outputs an internal clock enable signal ckes by synchronizing buffered clock enable signal ckel outputted from the CKE normal buffer 200 with the internal clock signal intCLKp. When the internal clock enable signal ckes is activated, if the auto refresh command AREFP6 is detected, the CKE level signal clk_sw is activated and the self refresh command generation unit 800 generates the self refresh command sref in response to the CKE level signal clk_sw. Therefore, the semiconductor memory device is entered into the self refresh mode.

Subsequently, the clock self refresh buffer 400 goes to a standby mode and an operation of the CKE self refresh buffer 300 is started. On the other hand, operations of the clock normal buffer 100 and the CKE normal buffer 200 are halted.

Thereafter, the clock enable signal CKE is transited to a logic high level and a command for exiting from the self refresh mode is applied. Accordingly, since the self refresh clock enable signal ckel_s inputted through the CKE self refresh buffer 300 is transited to a logic high level, the CKE level detection unit 700 inactivates the CKE level signal clk_sw. And then, the clock self refresh buffer 400 operated in response to the CKE level signal clk_sw outputs an inversed clock strobe signal sref_clkz and the clock strobe signal clk_sref by detecting a rising edge of the external clock signal CLK, and the CKE clock synchronization unit 600 inactivates the internal clock enable signal ckes in response to the inverted clock strobe signal sref_clkz. When the clock strobe signal clk_sref is activated in a logic low level, since the CKE level signal clk_sw and the internal clock enable signal ckes are maintained in a logic low level, the self refresh command generation unit 800 exits from the self refresh mode by inactivating the self refresh command sref.

Subsequently, since the clock normal buffer 100 and the CKE normal buffer 200 are operated in response to the self refresh command sref, the output signal ckel of the CKE normal buffer 200 is transited to a logic low level in response to the clock enable signal CKE, and the internal clock generation unit 500 generates the internal clock signal intCLKp in response to the output signal intCLKl of the clock normal buffer 100. On the other hand, the operations of the CKE self refresh buffer 300 and the clock self refresh buffer 400 are terminated by the self refresh command sref.

Figure 1:
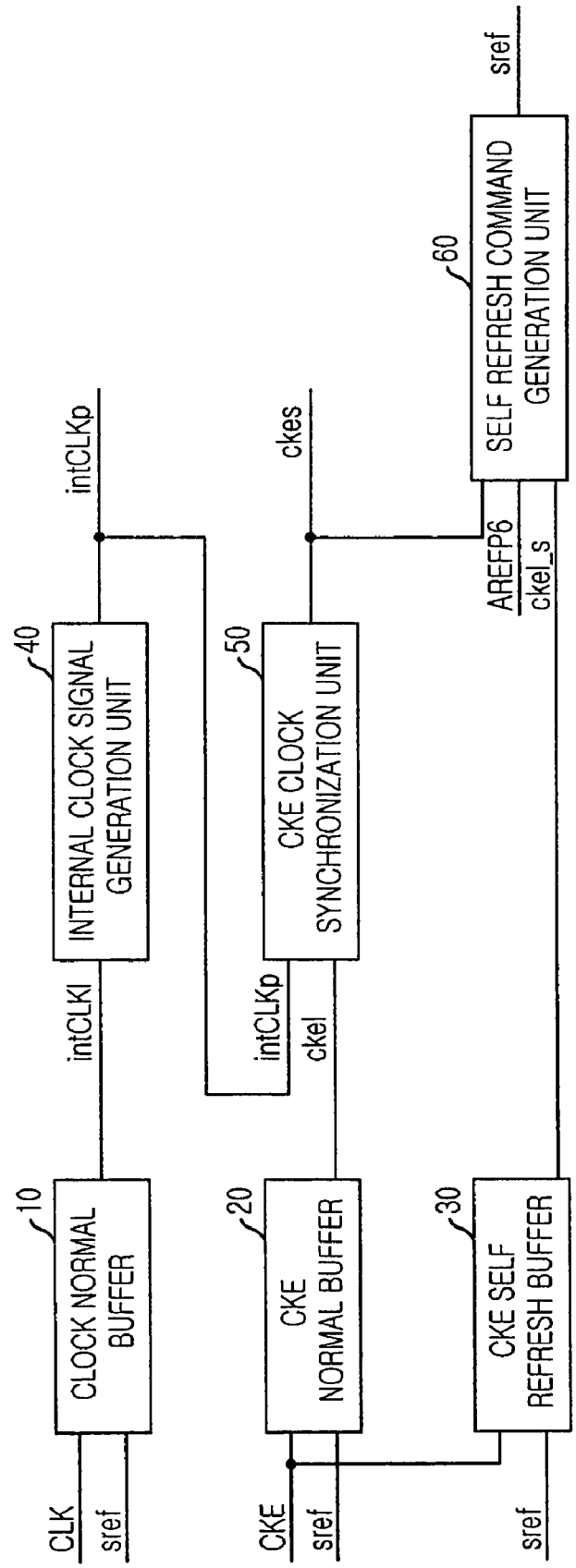
FIG. 1 is a block diagram illustrating a semiconductor memory device for a conventional self refresh mode.
Figure 2:
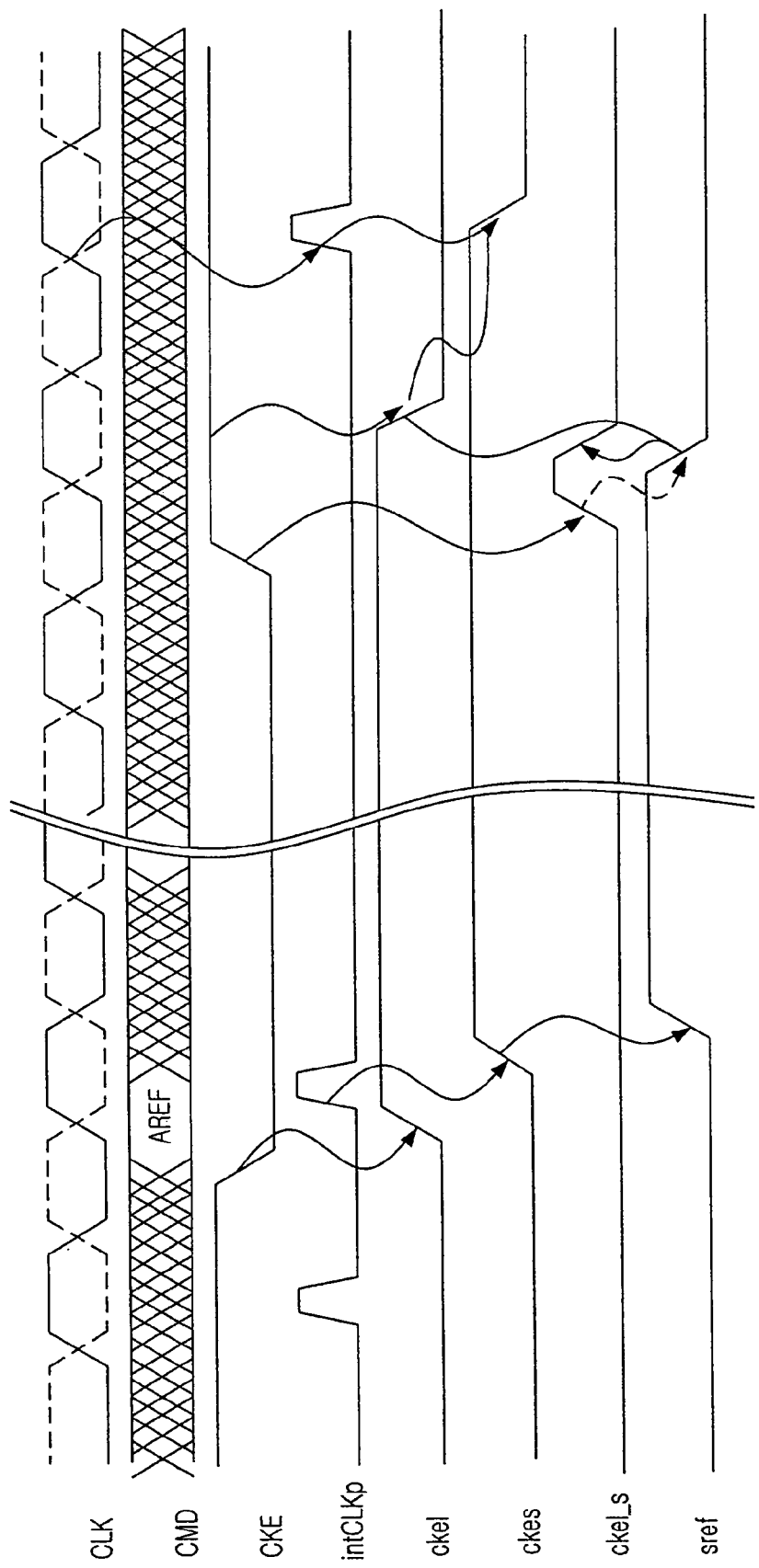
FIG. 2 is a timing diagram illustrating an operation of the semiconductor memory device of FIG. 1.

Compared with the operation of FIG. 2, if the clock enable signal CKE is activated in accordance with the present invention, the clock self refresh buffer 400 employed in the self refresh mode is operated to thereby detect the rising edge of the external clock signal. The self refresh mode is terminated only when a logic level of the clock enable signal CKE detected in the rising edge of the external clock signal is maintained to satisfy a setup time and a hold time.

Accordingly, the self refresh mode is not terminated only by the clock enable signal CKE in accordance with the present invention. The self refresh mode is terminated by determining whether the clock enable signal CKE is effective through the rising edge of the external clock signal, so that a malfunction of the semiconductor memory device due to a ineffective clock enable signal can be prevented.

Figure 5:
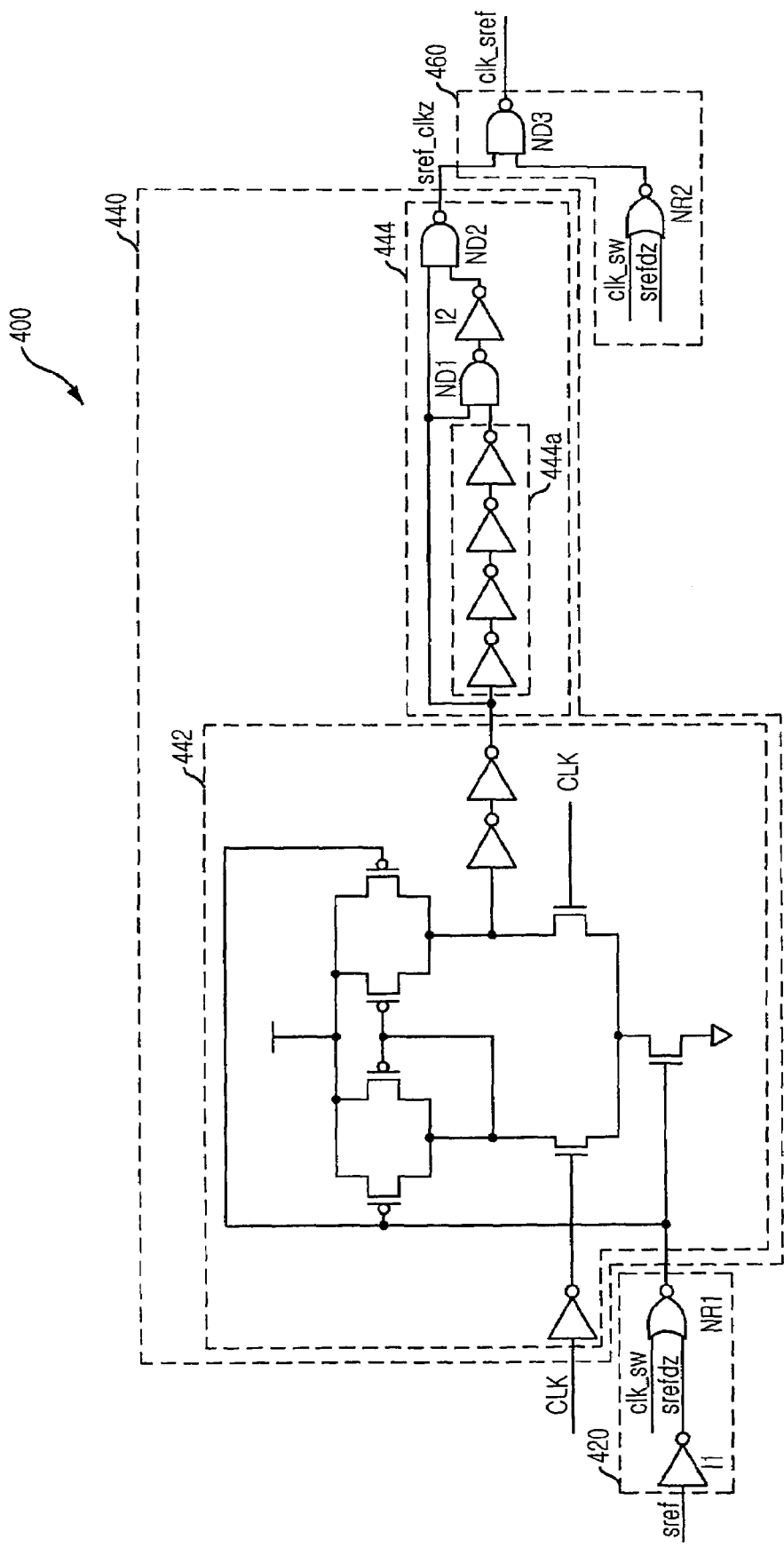
FIG. 5 is a circuit diagram illustrating the clock refresh buffer in FIG. 3.

FIG. 5 is a circuit diagram illustrating the clock self refresh buffer 400 in FIG. 3 in accordance with the preferred embodiment of the present invention.

As shown, the clock self refresh buffer 400 includes a signal generation unit 440, a drive control unit 420 and an output control unit 460. The signal generation unit 440 strobes the external clock signal CLK and the drive control unit 420 drives the signal generation unit 440 when the self refresh signal sref and the CKE level sigal clk_sw are activated. The output control unit 460 receives and outputs an output signal of the signal generation unit 440 in response to an inverted self refresh signal srefdz and the CKE level signal clk_sw.

The signal generation unit 440 includes a signal edge detection unit 442 for detecting an edge of the external clock signal CLK under control of the drive control unit 420 and a pulse width extension unit 444 for extending a pulse width of an output signal of the signal edge detection unit 442. The pulse width extension unit 444 includes a delay unit 444a for delaying the output signal of the signal edge detection unit 442, a first NAND gate ND1 receiving the output signal of the signal edge detection unit 442 and an output signal of the delay unit 444a, an inverter I2 and a second NAND gate ND2 outputting the inverted clock strobe signal sref_clkz by receiving output signals of the inverter I2 and the signal edge detection unit 442.

The output control unit 460 includes a NOR gate NR2 receiving the inverted self refresh signal srefdz and the CKE level signal clk_sw and a third NAND gate ND3 outputting the clock strobe signal clk_sref by receiving an output signal and the output signal of the signal generation unit 440.

The drive control unit 420 includes an inverter I1 for inverting the self refresh signal sref and a NOR gate NR1 outputting a signal for driving the signal generation unit 440 by receiving an output signal srefdz of the inverter I1 and the CKE level signal clk_sw.

An operation of the clock self refresh buffer 400 will be, hereinafter, described. The self refresh clock buffer 400 keeps the clock strobe signal clk_sref to a logic high level by the output control unit 460 receiving the inverted self refresh signal srefdz and the CKE level signal in the normal mode. Also, when the self refresh signal sref is activated, the clock self refresh buffer 400 goes to a standby mode. Thereafter, if the CKE level signal is activated, the drive control unit 420 drives the signal edge detection unit 442 to thereby output an output signal of a logic low level by detecting a rising edge of the external clock signal CLK. Subsequently, the pulse width extension unit 444 outputs the inverted clock strobe signal sref_clkz by extending an activation period of the output signal of the signal edge detection unit 442, and the output control unit 460 receives the inverted clock strobe signal sref_clkz and outputs the clock strobe signal clk_sref.

As mentioned above, since the clock self refresh buffer 400 is configured to have a relatively much smaller size than the clock normal buffer 100 operated in the normal mode and is operated only after the CKE level signal clk_sw is inactivated in the self refresh mode, the power consumption is very low.

Figure 6:
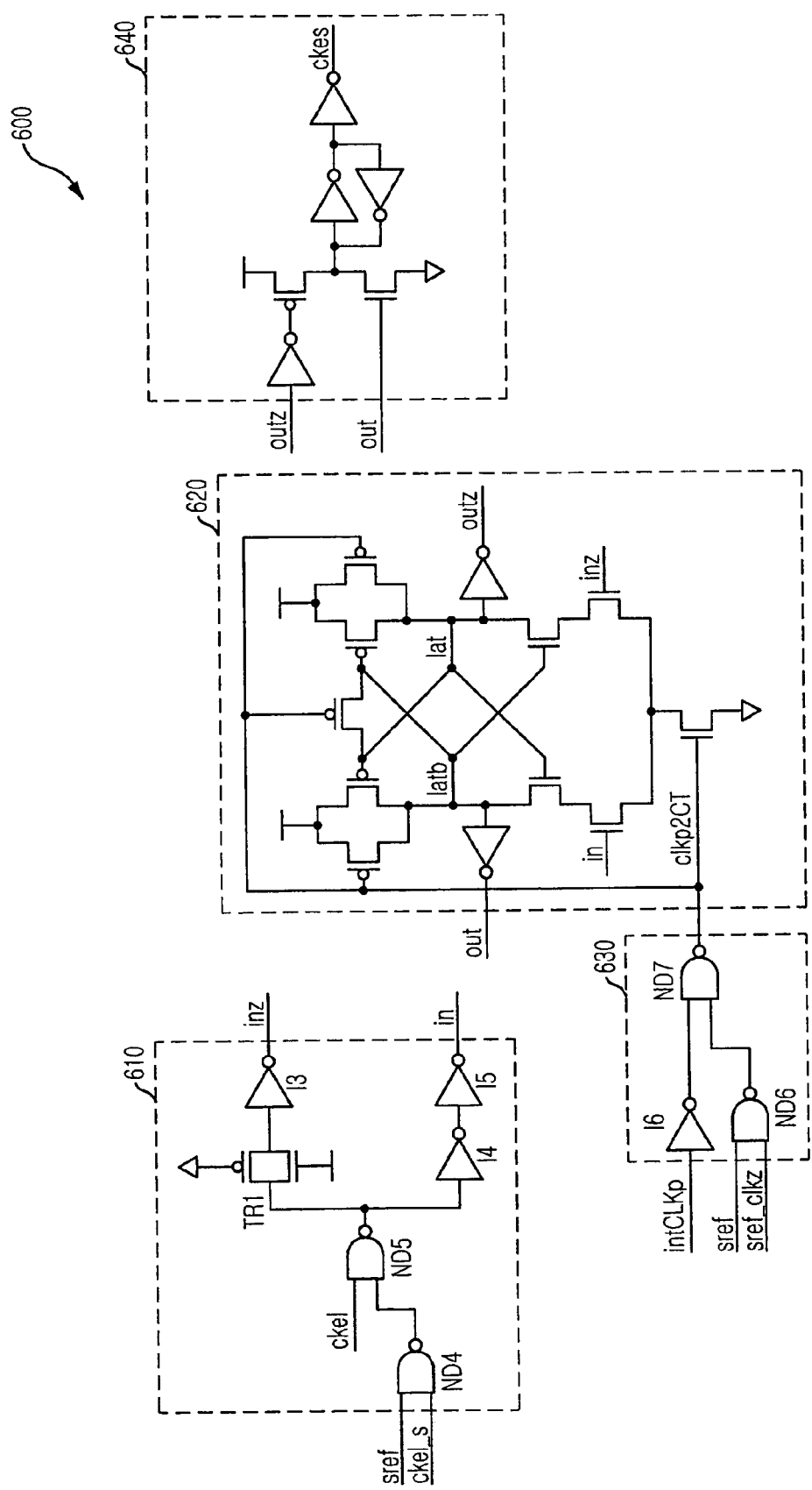
FIG. 6 is a circuit diagram showing the CKE clock synchronization unit in FIG. 3.

FIG. 6 is a circuit diagram showing the CKE clock synchronization unit 600 in FIG. 3 in accordance with the present invention.

As shown, the CKE clock synchronization unit 600 includes an input signal generation unit 610, an output signal strobe unit 620, a drive control unit 630 and an output signal generation unit 640. The output signal strobe unit 620 strobes input signals in and inz, and the operation control unit 630 controls an operation of the output signal strobe unit 620 in response to the inverted clock strobe signal sref_clkz and the self refresh signal sref. The output signal generation unit 640 produces the internal clock enable signal ckes by receiving the output signals out and outz of the output signal strobe unit 620. The input signal generation unit 610 generates the input signals in and inz by receiving the buffered clock enable siganal ckel of the CKE normal buffer 200 according to the self refresh command sref and the self refresh clock enable signal ckel_s.

The operation control unit 630 includes a NAND gate ND6 receiving the self refresh command sref and the inverted clock strobe signal sref_clkz, and a NAND gate ND7 for controlling the operation of the output signal strobe unit 620 by receiving an output signal of the NAND gate ND6 and the inverted internal clock signal from an inverter I6.

The input signal generation unit 610 includes NAND gates ND4 and ND5, a transfer gate TR1 and inverters I3, I4 and I5. The NAND gate ND4 receives the self refresh signal sref and the self refresh clock enable signal ckel_s, and the NAND gate NAND5 receives an output signal of the NAND gate ND4 and the buffered clock enable signal ckel from the CKE normal buffer 200. The transfer gate TR1 transfers an output signal of the NAND gate ND5 and the inverter I3 outputs the input signal inz by inverting an output signal of the transfer gate TR1. The inverters I4 and I5 output the input signal in by delaying an output signal of the NAND gate ND5.

An operation of the CKE clock synchronization unit 600, hereinafter, will be briefly described.

When an output signal clkp2CT of the operation control unit 630 is in a logic low level, the output signal strobe unit 620 outputs the internal clock enable signal ckes of a logic low level. When the output signal clkp2CT of the operation control unit 630 is in a logic high level, a logic level of the internal clock enable signal ckes is determined according to the input signals in and inz applied from the input signal generation unit 610.

In the normal mode, the operation control unit 630 outputs the signal clkp2CT for operating the output signal strobe unit 620 by receiving the internal clock signal intCLKp, and the input signal generation unit 610 outputs the signal inz having the same level with the output signal ckel of the CKE normal buffer 200 and the input signal in having the inverse level for the input signal inz. Therefore, the output signal strobe unit 620 outputs the output signal out with a logic high level and the output signal generation unit 640 outputs the internal clock enable signal ckes in a logic low level.

In the self refresh mode, the operation control unit 630 outputs the signal clkp2CT in response to the inverted clock strobe signal sref_clkz, and the input signal generation unit 610 outputs the input signal in having the same level with the self refresh clock enable signal ckel_s. Therefore, if the self refresh clock enable signal ckel_s is activated in response to the inverted clock strobe signal sref_clkz, the output signal strobe unit 620 outputs the output signal out in a logic high level and the output signal generation unit 640 outputs the internal clock enable signal ckes in a logic low level in response to the output signal out.

Figure 7:
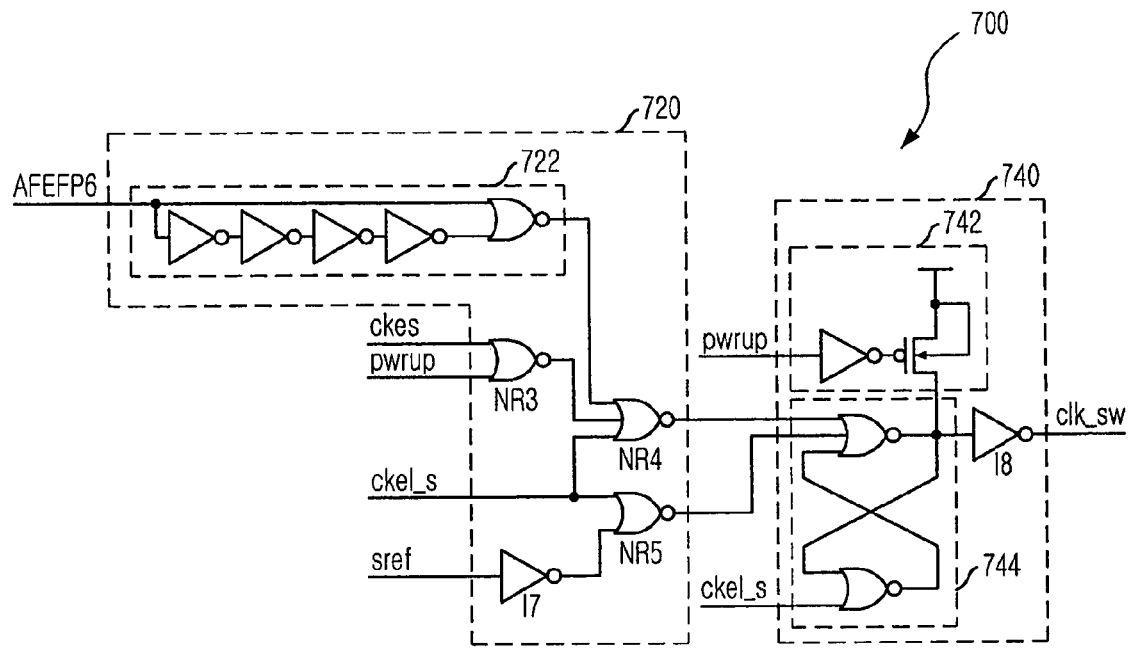
FIG. 7 is a circuit diagram illustrating the CKE level detection unit in FIG. 3.

FIG. 7 is a circuit diagram illustrating the CKE level detection unit 700 in FIG. 3 in accordance with the present invention.

As shown, the CKE level detection unit 700 includes a set signal generation unit 720 and a signal generation unit 740. The set signal generation unit 720 generates a set signal by receiving the auto refresh signal AREFP6 and the internal clock enable signal ckes. The signal generation unit 740 activates the CKE level signal clk_sw in response to the set signal and inactivates the CKE level signal clk_sw in response to the self refresh clock enable signal ckel_s.

The set signal generation unit 720 includes a pulse width extension unit 722, NOR gates NR3, NR4 and NR5 and an inverter I7. The pulse width extension unit 722 extends a pulse width of the auto command refresh signal AREFP6 and inverts the auto command refresh signal AREFP6. The NOR gate NR3 receives the internal clock enable signal ckes and a power up signal pwrup, and the NOR gate NR4 outputs a single set signal by receiving output signals of the pulse width extension unit 722 and the NOR gate NR3 and self refresh clock enable signal ckel_s. The NOR gate NR5 outputs another set signal by receiving the self refresh clock enable signal ckel_s and the inverted self refresh command from the inverter I7.

The signal generation unit 740 includes a RS flip flop 744, an initialization unit 742 and an inverter I8. The RS flip flop 744 activates an output signal thereof in response to the set signal, which is the output signal of the set signal generation unit 720, and inactivates the output signal thereof in response to the self refresh clock enable signal ckel_s. The initialization unit 742 initializes an output node of the RS flip flop 744 in response to the power up signal pwrup, and the inverter I8 outputs the CKE level signal clk_sw by inverting the output signal of the RS flip flop 744.

The CKE level detection unit 700 outputs the CKE level signal clk_sw only when the self refresh clock enable signal ckel_s is in a logic low level since the auto refresh signal AREFP6 and the internal clock enable signal ckes, which are the input signals of the set signal generation unit 720, are activated. The CKE level signal clk_sw is held by the NOR gate NR5 in the set signal generation unit 720 and is inactivated by the set signal generation unit 740 when the self refresh clock enable signal is activated.

Figure 8:
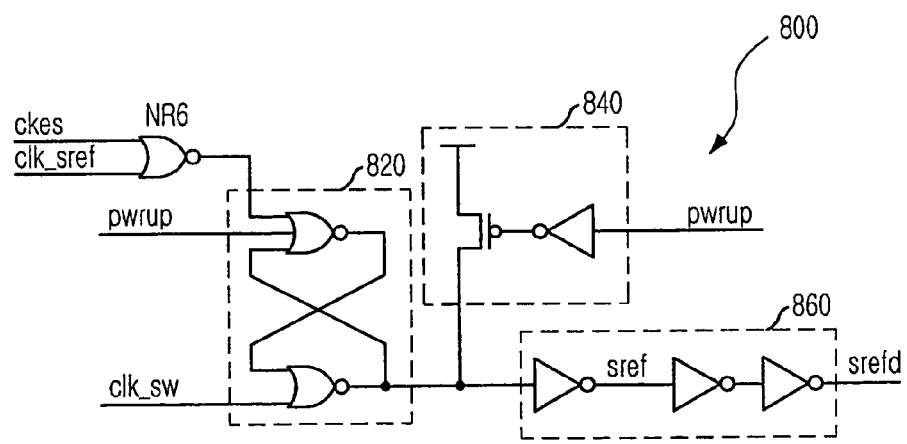
FIG. 8 is a circuit diagram illustrating the self refresh command generation unit in FIG. 3.

FIG. 8 is a circuit diagram illustrating the self refresh command generation unit 800 in FIG. 3 in accordance with the present invention.

As shown, the self refresh command generation unit 800 includes a NOR gate NR6, a RS flip flop 820, an initialization unit 840 and an output unit 860. The NOR gate NR6 receives the internal clock enable signal ckes and the clock strobe signal clk_sref, and the RS flip flop 820 receives an output signal of the NOR gate NR6 and the power up signal pwrup as a reset signal and the CKE level signal clk_sw as a set signal. The initialization unit 840 initializes an output node of the RS flip flop 820 and the output unit 860 generates the self refresh command sref by inverting an output signal of the RS flip flop 820 and outputs a self refresh delay signal srefd by delaying the self refresh command sref.

The self refresh command generation unit 800 activates the self refresh command sref when the CKE level signal clk_sw is activated, and inactivates the self refresh command sref when the internal clock enable signal ckes and the clock strobe signal clk_sref are inactivated. Namely, in the self refresh mode, if the clock enable signal CKE is activated, the rising edge of the external clock signal CLK is detected, and then, after it is determined whether the clock enable signal satisfies a setup time and a hold time through the clock strobe signal clk_sref at the detected rising edge of the external clock signal CLK, the self refresh command sref is inactivated to thereby terminate the self refresh mode. Therefore, even if the ineffective clock enable signal is occurred, a malfunction of the semiconductor memory device can be prevented.

Figure 9:
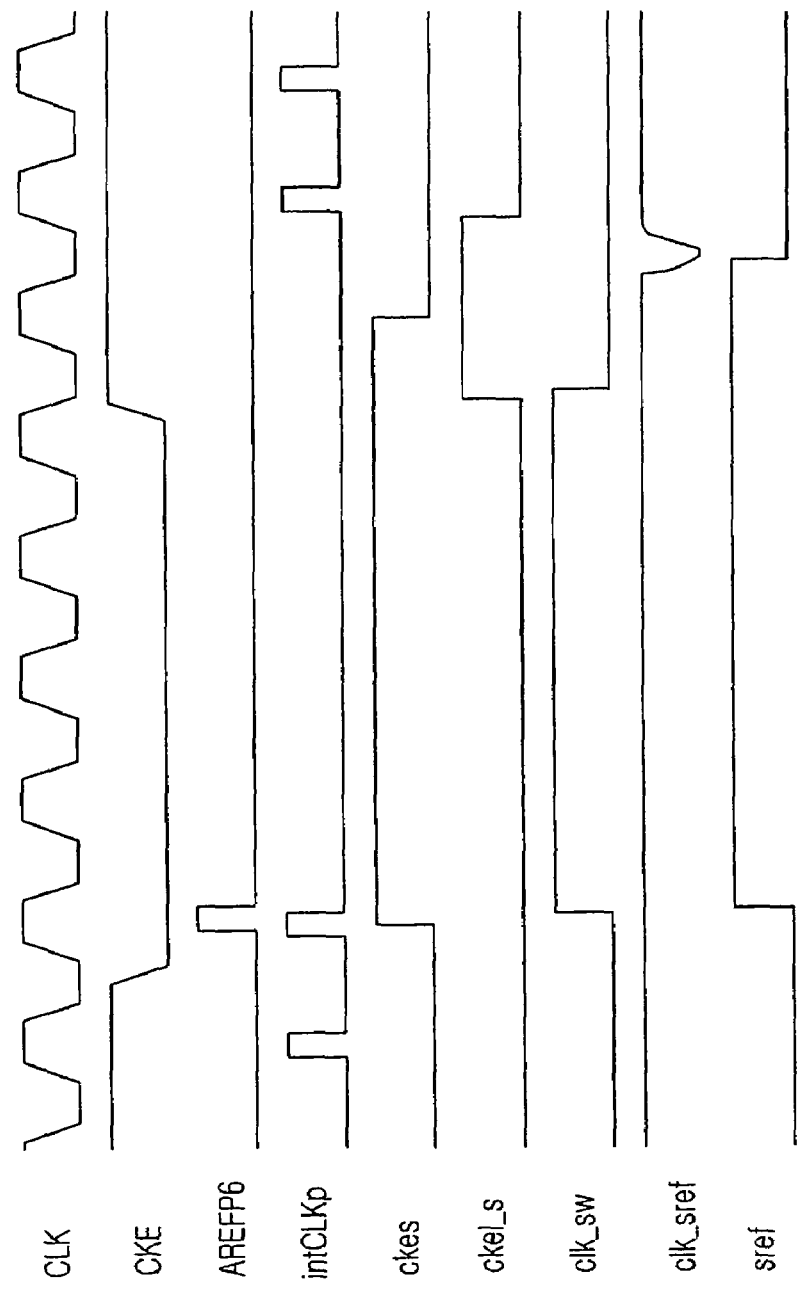
FIG. 9 is a waveform showing a simulation result of an operation of the semiconductor memory device in FIG. 3.

FIG. 9 is a waveform showing a simulation result of an operation of the semiconductor memory device in FIG. 3 in accordance with the present invention.

As shown, after the clock enable signal CKE is activated, the clock strobe signal clk_sref is activated to a logic low level by detecting a rising edge of the external clock signal CLK and then the self refresh command sref is inactivated to thereby exit from the self refresh mode.

Figure 10A:
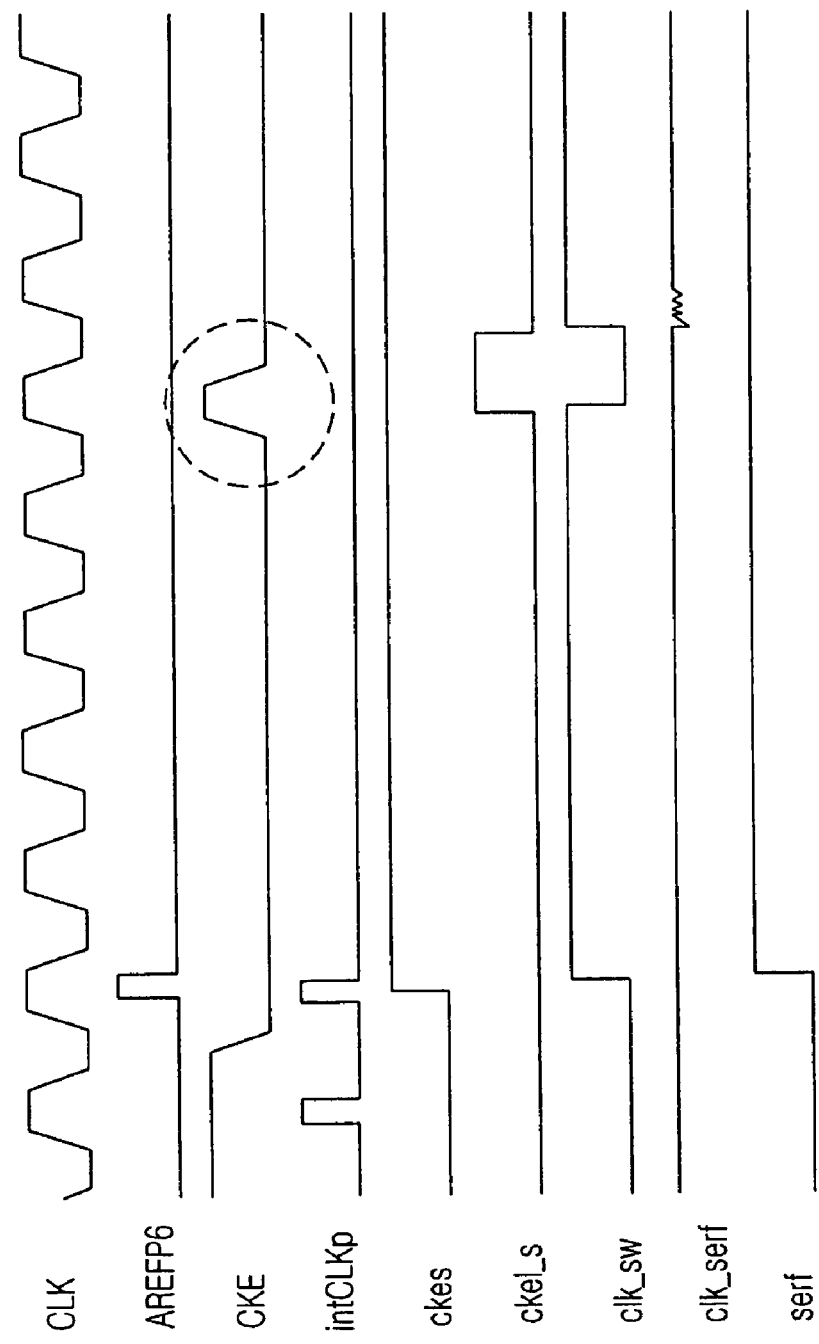
FIG. 10A is a waveform showing a result simulating an operation of the semiconductor memory device when an ineffective clock enable signal is occurred in FIG. 3.

FIG. 10A is a waveform showing a result simulating an operation of the semiconductor memory device when an ineffective clock enable signal is occurred in FIG. 3 in accordance with the present invention.

As shown, even if the ineffective clock enable signal is applied, since the clock enable signal does not satisfy the setup time and the hold time for the clock strobe signal clk_sref detecting the rising edge of the external clock signal CLK, it is identified that the self refresh mode is not terminated.

FIG. 10B is a waveform showing a result simulating an operation of the semiconductor memory device when an ineffective clock enable signal is activated while the external clock signal is not applied in FIG. 3 in accordance with the present invention.

As shown, even if the clock enable signal CKE is activated, since the external clock signal is not applied, the clock strobe signal clk_sref is not activated to a logic low level. Therefore, the self refresh mode is not terminated.

Figure 11:
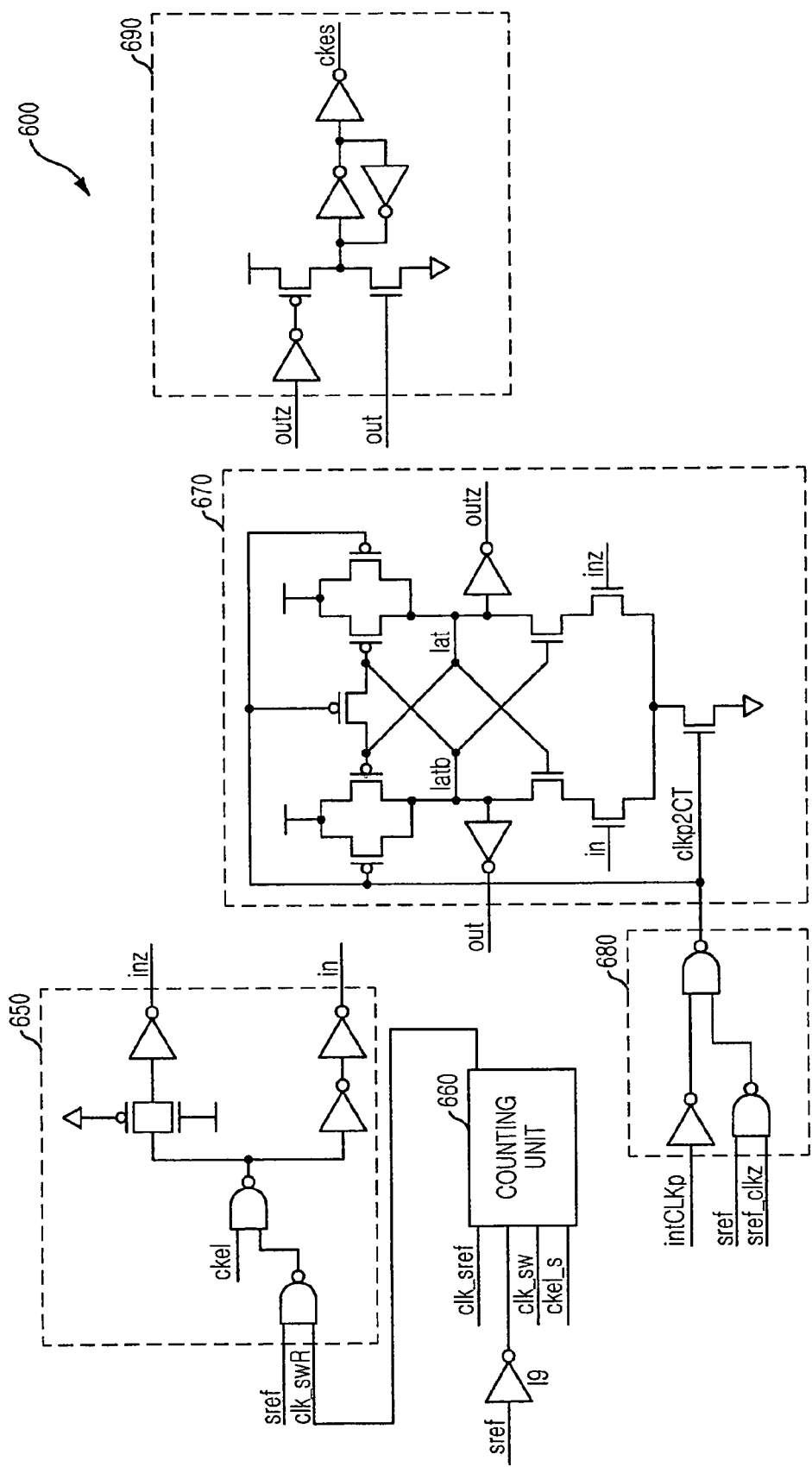
FIG. 11 is a circuit diagram illustrating the CKE clock synchronization unit in FIG. 3 in accordance with another embodiment of the present invention.

FIG. 11 is a circuit diagram illustrating the CKE clock synchronization unit 600 in FIG. 3 in accordance with another embodiment of the present invention.

As shown, The CKE clock synchronization unit 600 includes an output signal strobe unit 670, a counting unit 660, an operation control unit 680, an output signal generation unit 690 and an input signal generation unit 650. The output signal strobe unit 670 strobes the input signals in and inz and the counting unit 660 counts the clock strobe signal clk_sref generated during the self refresh period. The operation control unit 680 controls an operation of the output signal strobe unit 670 in response to the inverted clock strobe signal sref_clkz and the self refresh command sref, and the output signal generation unit 690 generates the internal clock enable signal ckes by receiving the output signals out and outz of the output signal strobe unit 670. The input signal generation unit 650 generates the input signals in and inz by receiving the output signal ckel of the CKE normal buffer 200 in response to an output signal of the counting unit 660 and the self refresh clock enable signal sref.

Compared with the CKE clock synchronization unit 600 in FIG. 6 in accordance with the preferred embodiment of the present invention, the counting unit 660 is added in FIG. 11 in accordance with another embodiment of the present invention. The internal clock enable signal ckes is not transited to a logic low level before an output signal clk_swR of the counting unit 660 is applied to the input signal generation unit 650.

Figure 12:
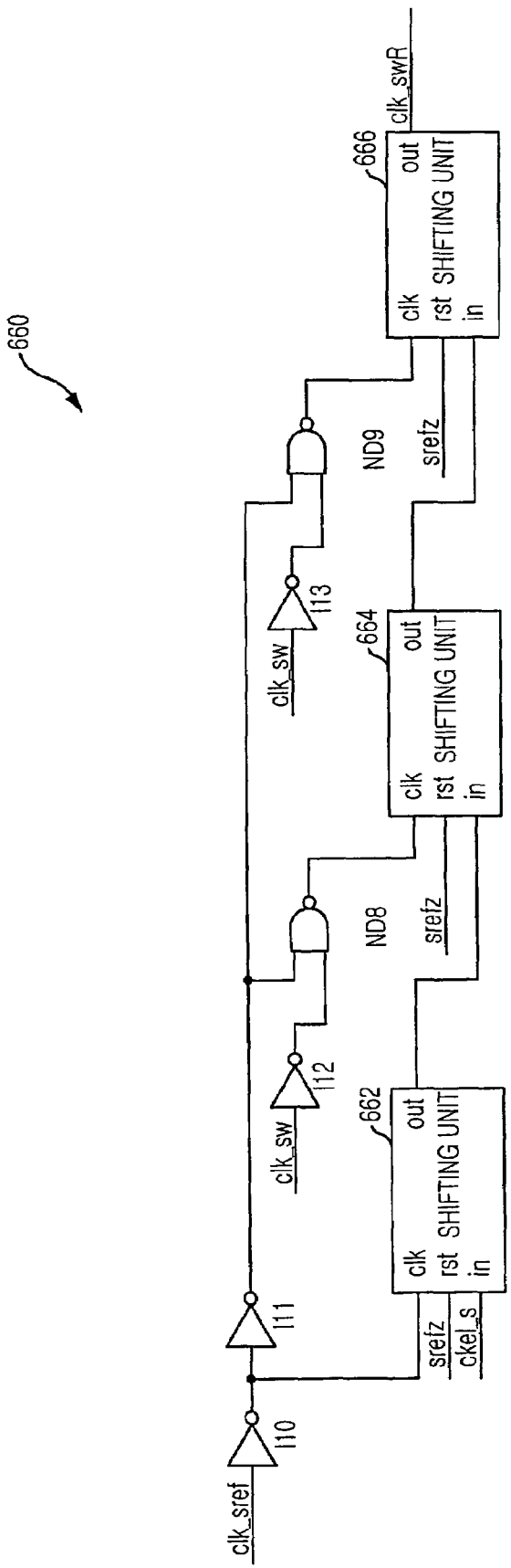
FIG. 12 is a schematic circuit diagram illustrating the counting unit in FIG. 11.

FIG. 12 is a schematic circuit diagram illustrating the counting unit 660 in FIG. 11.

As shown, the counting unit 660 includes shifting units 662, 664 and 666, inverters I10, I12 and I13, and NAND gates ND8 and ND9. The inverter I10 inverts the clock strobe signal clk_sref and the shifting unit 662 receives the inverted clock strobe signal as a clock signal clk, the inverted self refresh signal srefz as a reset signal and the self refresh clock enable signal ckel_s as an input signal in. The NAND gate ND8 receives an inverted signal of the output signal of the inverter I10 through the inverter I11 and an inverted CKE level signal and the shifting unit 664 receives an output signal of the NAND gate ND8 as a clock signal clk, the inverted self refresh signal srefz as a reset signal and an output signal of the shifting unit 662 as an input signal in. The NAND gate ND9 receives the output signal of the inverter I11 and the inverted CKE level signal, and the shifting unit 666 receives an output signal of the NAND gate ND9 as a clock signal clk, the inverted self refresh signal srefz as a reset signal and an output signal of the shifting unit 664 as an input signal in.

Since each of shifting units 662, 664 and 666 has the same circuit configuration, the shifting unit 662, for example, will be described.

Figure 13:
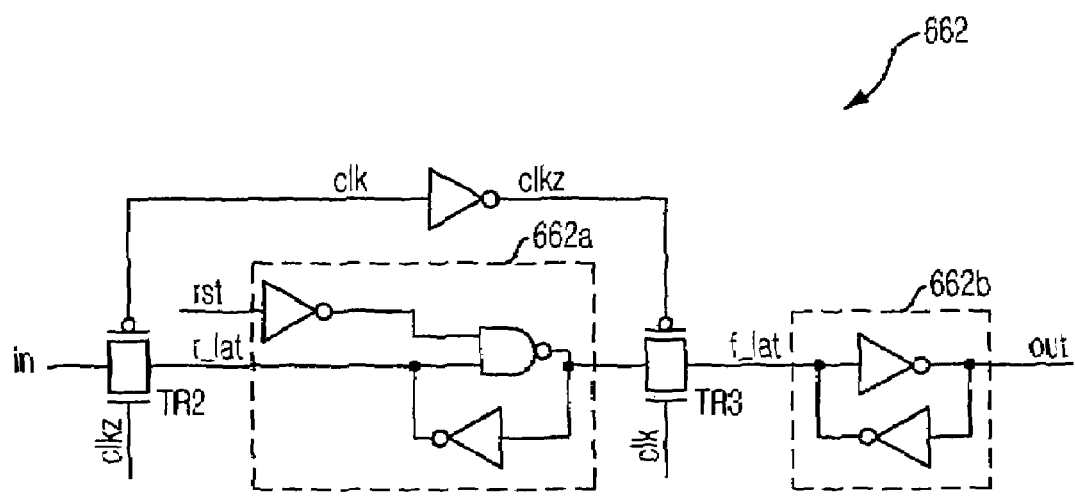
FIG. 13 is a circuit diagram illustrating the shifting unit in FIG. 12.

FIG. 13 is a circuit diagram illustrating the shifting unit 662 in FIG. 12.

As shown, the shifting unit 662 includes a transfer gate TR2 for transferring the input signal in when the clock signal is inactivated, a latch 662a for latching an output signal r_lat of the transfer gate TR2 under control of the reset signal rst, a transfer gate TR3 for transferring an output signal of the latch 662a when the clock signal clk is activated, and a latch 662b for latching and outputting an output signal f_lat of the transfer gate TR3.

Referring to FIGS. 11 to 13, an operation of the CKE clock synchronization unit 600 will be described.

In the self refresh mode, the CKE clock synchronization unit 600 does not output the internal clock enable signal ckes after the clock enable signal CKE is activated, but keep outputting the internal clock enable signal ckes after about 3 clock cycles since the clock enable signal CKE is activated to thereby terminate the self refresh mode. Namely, if the clock enable signal is not maintained for over 3 clock cycles, the refresh mode is not terminated and the DLL circuit, instead, is updated while the clock enable signal CKE is activated.

As mentioned above, since the DLL circuit is updated through the clock enable signal CKE activated during the self refresh mode, a setup value of the DLL circuit is not lost during the self refresh mode. Therefore, about 200 clock cycles corresponding to a setup time for the initialization operation of the DLL circuit are not needed after the self refresh mode is terminated.

Figure 14:
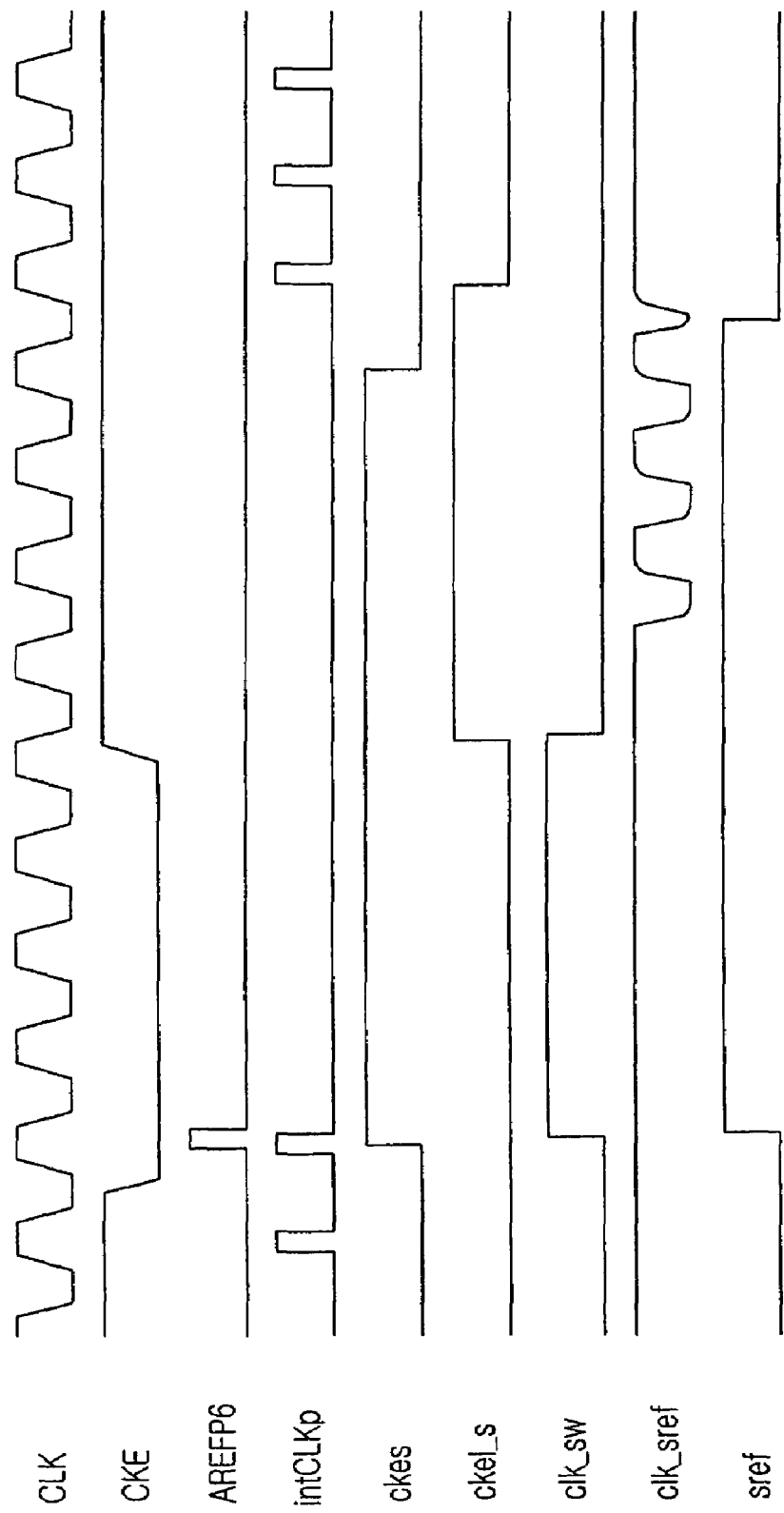
FIG. 14 is a waveform showing an simulation result of an operation of semiconductor memory device in the self refresh mode in accordance with another embodiment of the present invention.

FIG. 14 is a waveform showing an simulation result of an operation of semiconductor memory device in the self refresh mode when the CKE clock synchronization unit 600 in accordance with another embodiment of the present invention is employed.

As shown, after the clock strobe signal clk_sref, which is the output signal of the clock self refresh buffer 400, is activated for three times to a logic low level, the internal clock enable signal ckes is transited to a logic low level. Thereafter, the self refresh command sref is inactivated in synchronization with a falling edge of the clock strobe signal clk_sref to thereby terminate the self refresh mode.

Figure 15:
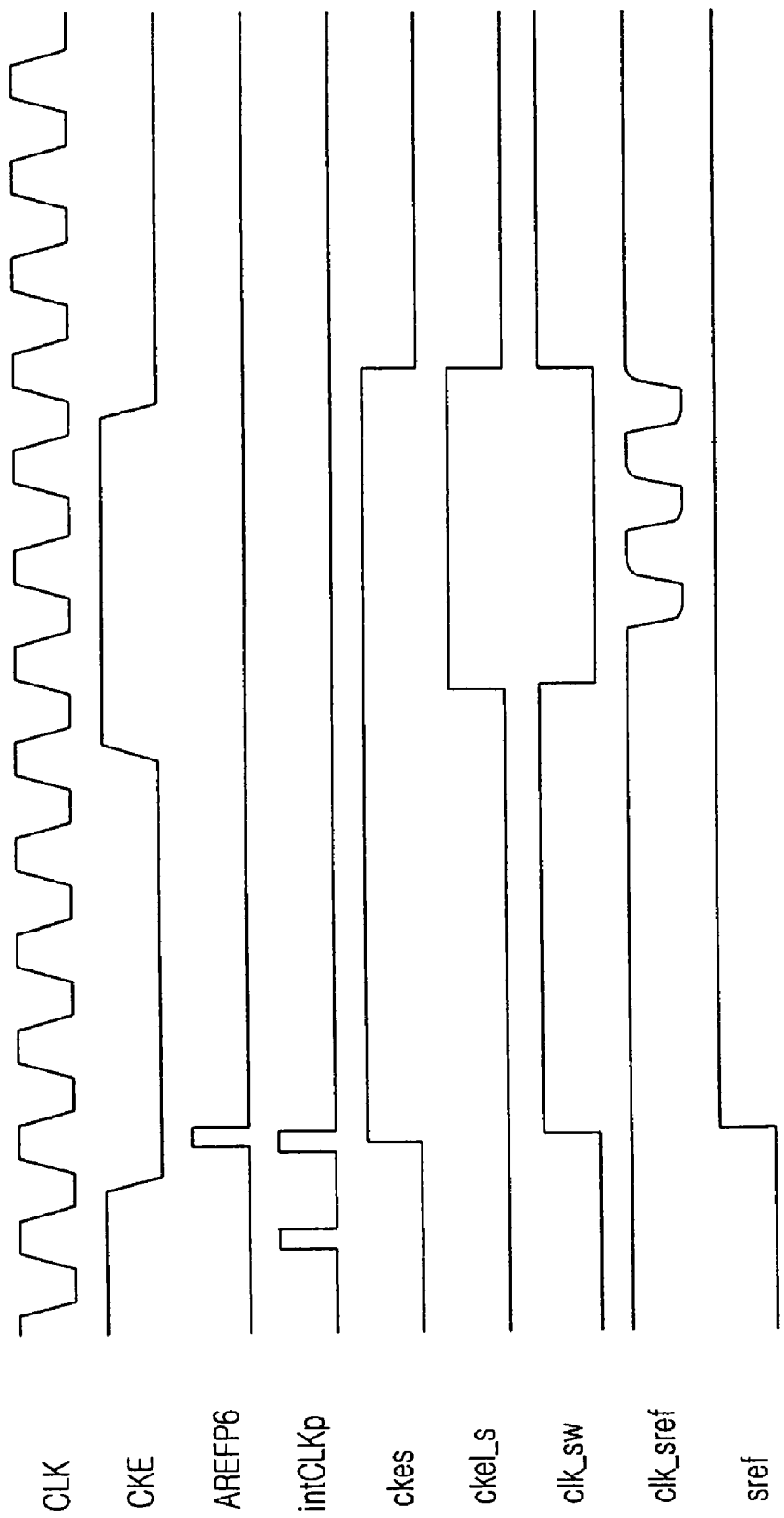
FIG. 15 is a waveform showing a simulation result of the DLL circuit update in the self refresh mode in accordance with another embodiment of the present invention.

FIG. 15 is a waveform showing a simulation result of the DLL circuit update in the self refresh mode in accordance with another embodiment of the present invention.

Compared to FIG. 14, the DLL circuit is updated by activating the clock enable signal CKE to a logic high level in the self refresh mode. After the update of the DLL circuit is completed, the clock enable signal is transited to a logic low level, so that the self refresh mode is not terminated. Namely, since the low activation process of the clock strobe signal clk_sref is not detected over three times, the self refresh command sref is not inactivated. Therefore, the self refresh mode does not exit.

In the self refresh mode in accordance with the present invention, when the activation of the clock enable signal is detected, the external clock signal is detected and then the self refresh mode is terminated only when the clock enable signal satisfies the setup time and the hold time for the rising edge of the external clock signal. Therefore, when the ineffective clock enable signal is occurred, the malfunction of the semiconductor memory device can be prevented.

Also, when predetermined power consumption is allowed during the self refresh mode for a high efficiency in a high frequency operation, the DLL circuit is maintained to an on state during the self refresh mode. Accordingly, the self refresh mode in accordance with the present invention is terminated only when a level of the clock enable clock signal is maintained for a predetermined clock cycle after the clock enable signal is activated. Also, the update process of the DLL circuit can be performed in the self refresh mode in accordance with the present invention.

Even if the predetermined time for updating the DLL circuit is three clock cycles, the time can be varied according to configuration of the semiconductor memory device.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device, comprising:
a clock enable signal self refresh buffer for generating a self refresh clock enable signal by receiving the clock enable signal in the self refresh mode;
an internal clock signal generating unit for generating an internal clock signal by receiving the external clock signal;
a signal synchronization unit for generating an internal clock enable signal by synchronizing the clock enable signal with the internal clock signal;
a level detection unit for generating a level detection signal by detecting levels of the internal clock enable signal and the self refresh clock enable signal;
a clock self refresh buffer for receiving the external clock signal during a self refresh mode in response to the level detection signal; and
a self refresh command generation unit for activating a self refresh command in response to the level detection signal and inactivating the self refresh command in response to the level detection signal and an output signal of the clock self refresh buffer.

2. The semiconductor memory device as recited in claim 1, further comprising:
a clock normal buffer for receiving the external clock signal in a normal mode; and
a clock enable signal normal buffer for receiving the clock enable signal in the normal mode.

3. A semiconductor memory device comprising:
a clock normal buffer for receiving an external clock signal in a normal mode;
a clock enable signal (CKE) normal buffer for receiving the CKE in the normal mode;
a CKE self refresh buffer for generating a self refresh clock enable signal by receiving the clock enable signal in the self refresh mode;
an internal clock generation unit for internal clock signal by receiving an output signal of the clock normal buffer;
a CKE clock synchronization unit for generating an internal clock enable signal by synchronizing the clock enable signal with the internal clock signal;
a CKE level detection unit for generating a CKE level detection signal by detecting levels of the internal clock enable signal and the self refresh clock enable signal;
a clock self refresh buffer for receiving the external clock signal during a self refresh mode in response to the CKE level detection signal; and
a self refresh command generation unit for activating a refresh command in response to the CKE level signal and inactivating the refresh command in response to the CKE level signal and an output signal of the clock self refresh buffer.

4. The semiconductor memory device as recited in claim 3, wherein the clock self refresh buffer includes:
a signal generation unit for strobing the external clock signal;
a drive control unit for driving the signal generation unit when the self refresh command and the CKE-level detection signal are activated; and
an output control unit for outputting clock strobe signal by controlling an output signal of the signal generation unit in response to the self refresh command and the CKE level signal.

5. The semiconductor memory device as recited in claim 4, wherein the signal generation unit includes:
a signal edge detection unit for detecting an edge of the external clock signal under control of the drive control unit; and
a pulse width extension unit for outputting a first clock strobe signal by extending a pulse width of an output signal of the signal edge detection unit.

6. The semiconductor memory device as recited in claim 4, wherein the output control unit includes:
a NOR gate receiving an inverted self refresh command and the CKE level signal; and
a NAND gate for outputting a second strobe signal by receiving an output signal of the NOR gate and an output signal of the signal generation unit.

7. The semiconductor memory device as recited in claim 4, wherein the drive control unit includes:
an inverter for inverting the self refresh command; and
a NOR gate for generating a control signal to drive the signal generation unit by receiving an output signal of the inverter and the CKE level signal.

8. The semiconductor memory device as recited in claim 5, wherein the pulse width extension unit includes:
a delay unit for delaying an output signal of the signal edge detection unit;
a first NAND gate receiving an output signal of the delay unit and the output signal of the signal edge detection unit;
an inverter for inverting an output signal of the first NAND gate; and
a second NAND gate for generating the first clock strobe signal by receiving output signals of the inverter and the signal edge detection unit.

9. The semiconductor memory device as recited in claim 3, wherein the CKE clock synchronization unit includes:
an output signal strobe unit for strobing input signals;
an operation control unit for controlling an operation of the output signal strobe unit in response to the clock strobe signal and the self refresh command;
an output signal generation unit for outputting the internal clock enable signal by receiving an output signal of the output signal strobe unit; and
an input signal generation unit for generating the input signals by receiving the output signal of the CKE normal buffer under control of the self refresh command and the self refresh clock enable signal.

10. The semiconductor memory device as recited in claim 9, wherein the operation control unit includes:
a first NAND gate receiving the self refresh command and the clock strobe signal; and
a second NAND gate for generating a control signal to control an operation of the output signal strobe unit by receiving an output signal of the first NAND gate and the internal clock signal.

11. The semiconductor memory device as recited in claim 9, wherein the input signal generation unit includes:
a first NAND gate receiving the self refresh command and the self refresh clock enable signal;
a second NAND gate output signals of the first NAND gate and the clock normal buffer;
a first inverter for outputting a first input signal by inverting an output signal of the second NAND gate; and
second and third inverters for outputting a second input signal by delaying the output signal of the second NAND gate.

12. The semiconductor memory device as recited in claim 11, wherein the output signal strobe unit for outputting the internal clock enable signal by receiving the first input signal under control of the operation control unit.

13. The semiconductor memory device as recited in claim 3, wherein the CKE level detection unit includes:
a set signal generation unit for generating a set signal by receiving an auto refresh signal and the internal clock enable signal; and a signal generation unit for activating the CKE level signal in response to the set signal and inactivating the CKE level signal in response to the self refresh clock enable signal.

14. The semiconductor memory device as recited in claim 13, wherein the set signal generation unit:
a pulse width extension unit for extending a pulse width of the auto refresh signal;
a first NOR gate receiving the internal clock enable signal and a power up signal;
a second NOR gate for outputting a first set signal by receiving output signals of the pulse width extension unit and the first NOR gate and the self refresh clock enable signal; and
a third NOR gate for outputting a second set signal by receiving self refresh clock enable signal and an inverted self refresh signal.

15. The semiconductor memory device as recited in claim 14, wherein the signal generation unit further includes:
a RS flip flop for activating an output signal of the RS flip flop in response to the first and second set signals and inactivating the output signal of the RS flip flop in response to the self refresh clock enable signal;
an initialization unit for initializing an output node of the RS flip flop in response to the power up signal; and
an inverter for outputting the CKE level signal by inverting an output signal of the RS flip flop.

16. The semiconductor memory device as recited in claim 3, wherein the self refresh command generation unit activates the self refresh command in response to activation of the CKE level signal and inactivates the self refresh command in response to the internal clock enable signal and the clock strobe signal.

17. The semiconductor memory device as recited in claim 16, wherein self refresh command generation unit includes:
a first NOR gate receiving the internal clock enable signal and the clock strobe signal;
a RS flip flop receiving an output signal of the first NOR gate and the power up signal as a reset signal and a CKE level signal as a set signal;
an initialization unit for initializing an output node of the RS flip flop; and
an output unit for outputting the self refresh command by inverting an output signal of the RS flip flop and a self refresh delay signal by delaying the self refresh command.

18. The semiconductor memory device as recited in claim 3, wherein the CKE clock synchronization unit includes:
an output signal strobe unit for strobing input signals;
a counting unit for counting the clock strobe signal in the self refresh period;
an operation control unit for controlling the output signal strobe unit in response to the clock strobe signal and the self refresh signal;
an output signal generation unit for generating the internal clock enable signal by receiving an output signal of the output signal strobe unit; and
an input signal generation unit for generating the input signals by receiving an output signal of the CKE normal buffer in response to an output signal of the counting unit and the self refresh clock enable signal.

19. The semiconductor memory device as recited in claim 18, wherein the counting unit includes:
a first shifting unit receiving an inverted clock strobe signal as a clock signal an inverted self refresh command as a reset signal and a self refresh clock enable signal as an input;

a first inverter for inverting the inverted clock strobe signal;

a first NAND gate receiving an output signal of the first inverter and the inverted CKE level signal;

a second shifting unit receiving an output signal of the first NAND gate as a clock signal, the inverted self refresh signal as a reset signal and an output signal of the first shifting unit as an input;

a second NAND gate receiving the output signal of the first inverter and the inverted CKE level signal; and a third shifting unit receiving an output signal of the second NAND gate as a clock signal, the inverted self refresh signal as a reset signal and an output signal of the second shifting unit as an input.

20. The semiconductor memory device as recited in claim 19, wherein each of the shifting units includes:

a first transfer gate for transferring the input signal when the clock signal is inactivated;

a first latch for latching an output signal of the first transfer gate in response to the reset signal;

a second transfer gate for transferring an output signal when the clock signal is activated; and a second latch for latching an output signal of the second transfer gate.

21. A self refresh method in a semiconductor memory device, comprising the steps of:

a) inactivating a clock enable signal and applying an auto refresh signal;

b) entering a self refresh mode in response to the clock enable signal synchronized with a clock signal;

c) receiving the clock enable signal in the self refresh mode;

d) activating the clock enable signal; and e) exiting from the self refresh mode in response to the clock enable signal synchronized with the internal clock signal.

22. The self refresh method as recited in claim 21, wherein the step e) includes the steps of:

e1) activating a control signal synchronized with the clock signal in response to activation of the clock enable signal;

e2) detecting whether the clock enable signal is activated during activation of the control signal; and e3) exiting from the self refresh mode according to a detection result.

23. A self refresh method in a semiconductor memory device, comprising the steps of:

a) activating a clock enable signal and applying an auto refresh signal;

b) entering a self refresh mode in response to the clock enable signal synchronized with an internal clock signal;

c) receiving the clock enable signal in the self refresh mode;

d) updating a set value of a DLL circuit by receiving an external clock signal and activating the clock enable signal for a predetermined time referring to the clock signal in the self refresh mode;

e) exiting from the self refresh mode in response to the clock enable signal synchronized with the clock signal when the clock enable signal is activated over the predetermined time.

* * * * *